United States Patent
Park et al.

(10) Patent No.: US 11,198,948 B2
(45) Date of Patent: Dec. 14, 2021

(54) TEMPERATURE CONTROL DEVICE FOR SINGLE CRYSTAL INGOT GROWTH AND TEMPERATURE CONTROL METHOD APPLIED THERETO

(71) Applicant: SK SILTRON CO., LTD., Gumi-si (KR)

(72) Inventors: Hyun Woo Park, Gumi-si (KR); Jung Ryul Kim, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 353 days.

(21) Appl. No.: 16/242,973

(22) Filed: Jan. 8, 2019

(65) Prior Publication Data

US 2019/0211471 A1    Jul. 11, 2019

(30) Foreign Application Priority Data

Jan. 9, 2018    (KR) .................. 10-2018-0002731

(51) Int. Cl.
*C30B 15/20*    (2006.01)
*C30B 15/14*    (2006.01)
(Continued)

(52) U.S. Cl.
CPC ............ *C30B 15/206* (2013.01); *C30B 15/14* (2013.01); *C30B 15/20* (2013.01); *C30B 29/06* (2013.01);
(Continued)

(58) Field of Classification Search
CPC ....... C30B 15/14; C30B 15/20; C30B 15/206; C30B 29/06; G05B 19/4155; G05B 2219/50333
See application file for complete search history.

(56) References Cited

U.S. PATENT DOCUMENTS

| 2005/0092236 A1* | 5/2005 | Bender ............... C30B 15/04 117/200 |
| 2006/0005761 A1 | 1/2006 | Kulkarni et al. |

(Continued)

FOREIGN PATENT DOCUMENTS

| CN | 1163867 A | 11/1997 |
| CN | 1737216 A | 2/2006 |

(Continued)

OTHER PUBLICATIONS

European Patent Office, English computer translation of JP 04-325488. (Year: 2021).*

(Continued)

*Primary Examiner* — Matthew J Song
(74) *Attorney, Agent, or Firm* — Lewis Roca Rothgerber Christie LLP

(57) ABSTRACT

The present invention relates to a temperature control device for growing a single crystal ingot capable of accurately measuring a temperature of a silicon melt and quickly controlling to a target temperature during an ingot growing process, and a temperature control method applied thereto. The present invention provides a temperature control device for growing a single crystal ingot, which controls an operation of a heater for heating a crucible configured to accommodate a silicon melt, the device including: an input unit configured to measure a temperature of the silicon melt accommodated in the crucible and process the measured temperature of the silicon melt; a control unit configured to perform a proportional-integral-derivative (PID) calculation of one of the measured temperature T1 and the processing temperature T2 of the input unit and a set target temperature T0 and calculate as an output of the heater; and an output unit configured to input the output of the heater calculated in the control unit to the heater.

6 Claims, 6 Drawing Sheets

(51) Int. Cl.
    *G05B 19/4155* (2006.01)
    *C30B 29/06* (2006.01)
(52) U.S. Cl.
    CPC ............... *G05B 19/4155* (2013.01); *G05B 2219/50333* (2013.01)

(56) References Cited

U.S. PATENT DOCUMENTS

| | | | |
|---|---|---|---|
| 2008/0223832 A1* | 9/2008 | Song | B23K 26/34 219/121.66 |
| 2010/0024716 A1 | 2/2010 | Orschel et al. | |
| 2011/0108228 A1* | 5/2011 | Mahapatra | B22D 11/0651 164/6 |
| 2018/0041217 A1* | 2/2018 | Murakami | H03B 5/364 |

FOREIGN PATENT DOCUMENTS

| | | |
|---|---|---|
| CN | 102912443 A | 2/2013 |
| CN | 103261492 A | 8/2013 |
| CN | 205474108 U | 8/2016 |
| JP | 1992-325488 A | 11/1992 |
| JP | 04325488 A * | 11/1992 ............. C30B 15/20 |
| JP | H04325488 A | 11/1992 |
| JP | 1997-175890 A | 7/1997 |
| JP | 2009161400 A | 7/2009 |
| KR | 20070012953 A | 1/2007 |
| KR | 10-2011-0085992 A | 7/2011 |
| KR | 20120045307 A | 5/2012 |
| KR | 10-1483435 B1 | 1/2015 |
| KR | 20160025821 A | 3/2016 |

OTHER PUBLICATIONS

Korean Office Action issued by KIPO, dated Jul. 2, 2019, for corresponding KR Application No. 10-2018-0002731 (2 pages).
Korean Notice of Allowance dated Jan. 2, 2020 for corresponding Application No. 10-2018-0002731 (2 pages).
Japanese Office Action dated Jan. 7, 2020 for corresponding Application No. 2019-00581 (3 pages).
Chinese Patent Office Action dated Aug. 28, 2020, issued in corresponding CN Application No. 201910015281.0, 5 pages.

* cited by examiner

TEMPERATURE CONTROL DEVICE FOR SINGLE CRYSTAL INGOT GROWTH AND TEMPERATURE CONTROL METHOD APPLIED THERETO

CROSS-REFERENCE TO RELATED APPLICATION

This application claims priority to and the benefit of Korean Patent Application No. 2018-0002731, filed on Jan. 9, 2018, the disclosure of which is incorporated herein by reference in its entirety.

TECHNICAL FIELD

The present invention relates to a temperature control device for growing a single crystal ingot capable of accurately measuring a temperature of a silicon melt and quickly controlling to a target temperature during an ingot growing process, and a temperature control method applied thereto.

BACKGROUND

In general, a single crystal ingot which is used as a material for producing an electronic component such as a semiconductor is fabricated by a Czochralski (hereinafter referred to as CZ) method.

In a method of fabricating a single crystal ingot by using the CZ method, a solid raw material such as polycrystalline silicon is filled in a quartz crucible and heated to be melted by a heater to form a silicon melt, and air bubbles in the silicon melt are removed via a stabilization process, and then a seed is dipped into the silicon melt, and the seed is slowly pulled up above the melt while forming a necking, so that a necking process, a shouldering process, a body growing process, and a tailing process are sequentially performed.

Of course, in the CZ method, since a silicon melt is heated by using a heater installed at a side surface of a crucible, natural convection occurs in the silicon melt.

At this point, since a necking process may determine quality of a shouldering process and a body growing process, for the necking process, a surface temperature of a melted silicon melt should be stably maintained and converged to a target temperature.

FIG. 1 is a side cross-sectional view schematically illustrating a single crystal growth device according to the related art, and FIG. 2 is a graph illustrating a temperature change of a single crystal growth device according to the related art in a necking process.

According to the related art, as shown in FIG. 1, one pyrometer 2 is installed at an upper end of a chamber 1, and one point of a surface of a silicon melt which is naturally convected into a crucible 3 by the pyrometer 2, is measured.

However, a surface temperature of the silicon melt for each batch which fabricates single crystal ingots one by one may change frequently due to hot-zone set-up, lifetime, etc., and may be different for each equipment.

In addition, as shown in FIG. 2, when a necking process is started during a single crystal ingot growing process, a temperature of a silicon melt tends to rise due to influence of a seed chuck.

Therefore, an operator directly changes a target temperature T0 of a silicon melt to provide optimum ingot production conditions and controls an operation of a heater 4 according to a difference value between a measured temperature T1 and the target temperature T0.

However, according to the related art, since only one pyrometer 2 is installed at the upper end of the chamber 1 in a direction perpendicular to a surface of the silicon melt, it is possible to measure a temperature only in a necking process, and even when the pyrometer 2 is moved horizontally in a subsequent body growing process, it is impossible to measure a surface temperature of the silicon melt since the pyrometer 2 is concealed by an ingot or a heat shield 5, or since a distance between the pyrometer 2 and the silicon melt is too long, the surface temperature of the silicon melt may be measured as noise data.

In addition, according to the related art, as the crucible 3 is rotated, natural convection inside the silicon melt accommodated therein changes, and when a rotation speed of the crucible 3 is low, a temperature deviation appears to large at the left and right sides of the silicon melt, and since the pyrometer 2 measures only a specific position of the surface of the silicon melt during the necking process, a temperature of the silicon melt may not be accurately measured, and since positions at which the temperature of the silicon melt is measured are different for each equipment, there are problems that not only repeatability of control is lowered but also quantification of control is impossible.

Further, according to the related art, even when a measured temperature of the silicon melt is obtained during the necking process, since the operation of the heater 4 is controlled via a P control which adjusts a value depending on the extent to which the measured temperature deviates from the target temperature, not only it takes much time to converge the temperature of the silicon melt to the target temperature but also it is difficult to continuously provide a uniform temperature environment during the growth of the single crystal ingot and as a result, there is a limit to quickly and accurately control quality of the single crystal ingot.

SUMMARY

The present invention is directed to solving the above-described problems in the related art and providing a temperature control device for growing a single crystal ingot capable of accurately measuring a temperature of a silicon melt and quickly controlling to a target temperature during an ingot growing process, and a temperature control method applied thereto.

According to an embodiment of the present invention, there is provided a temperature control device for growing a single crystal ingot, which controls an operation of a heater for heating a crucible configured to accommodate a silicon melt, the device including an input unit configured to measure a temperature of the silicon melt accommodated in the crucible and process the measured temperature of the silicon melt; a control unit configured to perform a proportional-integral-derivative (PID) calculation of one of the measured temperature T1 and the processing temperature T2 of the input unit and a set target temperature T0 and calculate as a output of the heater; and an output unit configured to input the output of the heater calculated in the control unit to the heater.

The input unit may include a sensor unit configured to measure the temperature of the silicon melt accommodated in the crucible at at least two positions, and a filtering part configured to perform noise-elimination filtering and arithmetic averaging on at least two measured temperatures T11 and T12 measured at the sensor unit to process to a processing temperature T2.

The sensor unit may include first and second temperature sensors installed at both sides of an upper portion of an enclosed chamber in which the crucible is accommodated in an inner space.

The first and second temperature sensors may be configured as a 1-color pyrometer or a 2-color pyrometer.

It is preferable that the first and second temperature sensors measure a temperature within a range of 10 cm from a diameter of the ingot grown from the silicon melt in the crucible.

The filtering part may apply the measured temperatures T11 and T12 measured during a sampling time ($\Delta t$) to model with a sine wave function and calculate into an optimal sine wave function having the smallest amplitude, and then input a time to the optimal sine wave function in real time so as to perform noise-elimination filtering.

The filtering part may model the optimal sine wave function with variables such as a measured temperature (T(t)), a sampling time ($\Delta t$), a cycle (Np$\Delta t$), a frequency ($\omega = 2\pi/(Np\Delta t)$), and a current time (t).

The control unit may include a determination part configured to select one of the measured temperature T1 and the processing temperature T2 according to an external input signal, and a PID calculation part configured to perform PID calculation of one of the measured temperature T1 and the processing temperature T2 selected at the determination part and the target temperature T0.

Meanwhile, according to another embodiment of the present invention, there is provided a temperature control method for growing a single crystal ingot, which controls an operation of a heater for heating a crucible configured to accommodate a silicon melt, the method including: an input operation of measuring a temperature of the silicon melt accommodated in the crucible and processing the measured temperature of the silicon melt; a control operation of performing a proportional-integral-derivative (PID) calculation of one of the measured temperature T1 and the processing temperature T2 in the input operation and a set target temperature T0 and calculating as an output of the heater; and an output operation of inputting the output of the heater calculated in the controlling to the heater.

The input operation may include a temperature measuring process of measuring the temperature of the silicon melt accommodated in the crucible at at least two positions, and a filtering process of performing noise-elimination filtering and arithmetic averaging on at least two measured temperatures T11 and T12 measured in the temperature measuring to process to a processing temperature T2.

The temperature measuring process may be performed in a non-contact manner at both upper sides of an enclosed chamber in which the crucible is accommodated in an inner space.

In the temperature measuring process, it is preferable to measure a temperature within a range of 10 cm from a diameter of the ingot grown from the silicon melt in the crucible.

The filtering process may apply the measured temperatures T11 and T12 measured during a sampling time ($\Delta t$) to model with a sine wave function and calculate into an optimal sine wave function with the smallest amplitude, and then input a time to the optimal sine wave function in real time so as to perform noise-elimination filtering.

The filtering process may model the optimal sine wave function with variables such as a measured temperature (T(t)), a sampling time ($\Delta t$), a cycle (Np$\Delta t$), a frequency ($\omega = 2\pi/(Np\Delta t)$), and a current time (t).

The controlling may include determination for selecting one of the measured temperature T1 and the processing temperature T2 according to an external input signal and PID calculation process for PID calculation of one of the measured temperature T1 and the processing temperature T2 selected at the determination, and the target temperature T0.

DETAILED DESCRIPTION OF THE EMBODIMENTS

Hereinafter, embodiments will be described in detail with reference to the accompanying drawings. However, the scope of the spirit of the present invention may be determined from the matters disclosed in the embodiments, and the spirit of the present invention of the embodiments includes practical modifications such as addition, deletion, modification, and the like of components to the following proposed embodiments.

Figure 1:
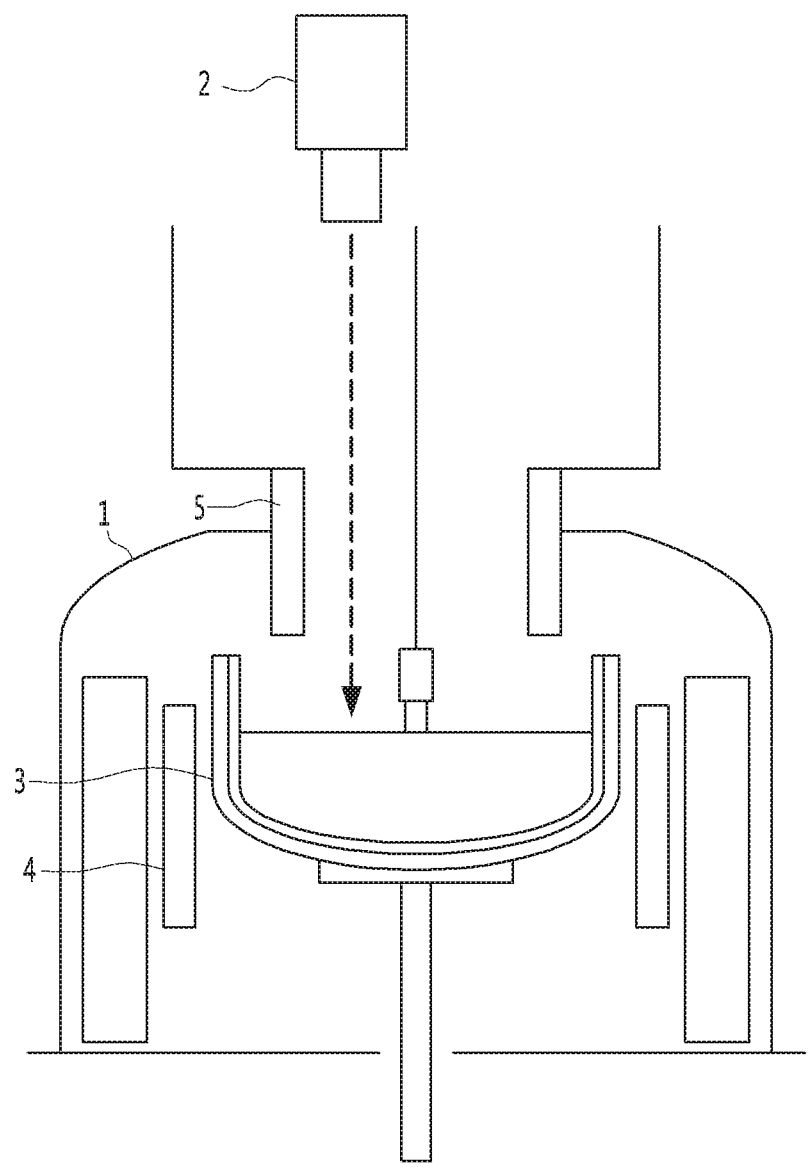
FIG. 1 is a side cross-sectional view schematically illustrating a single crystal growth device according to the related art.
Figure 2:
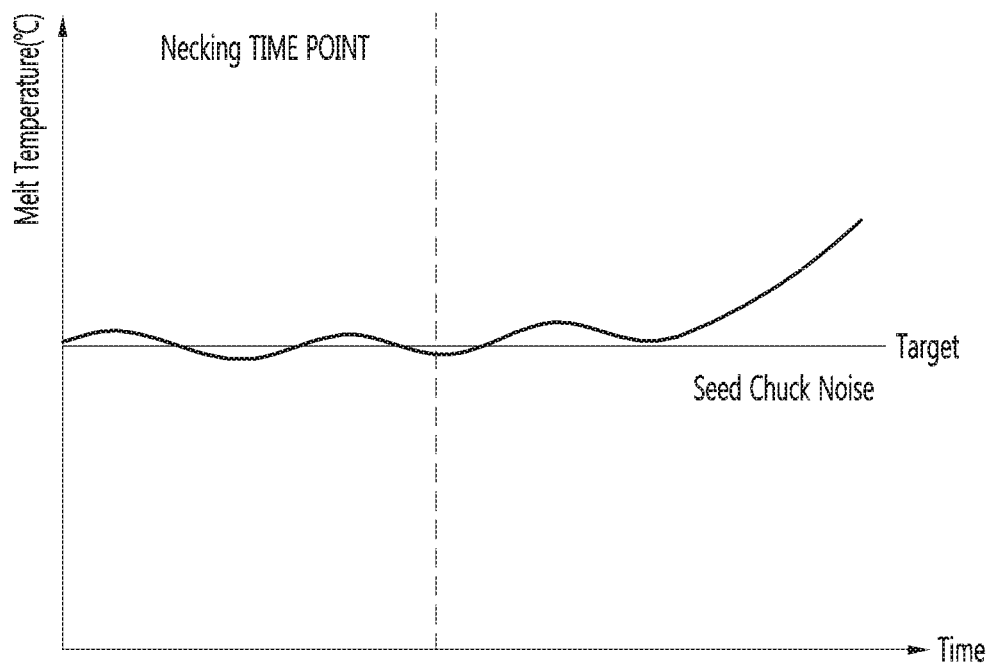
FIG. 2 is a graph illustrating a temperature change of a single crystal growth device during a necking process according to the related art.
Figure 3:
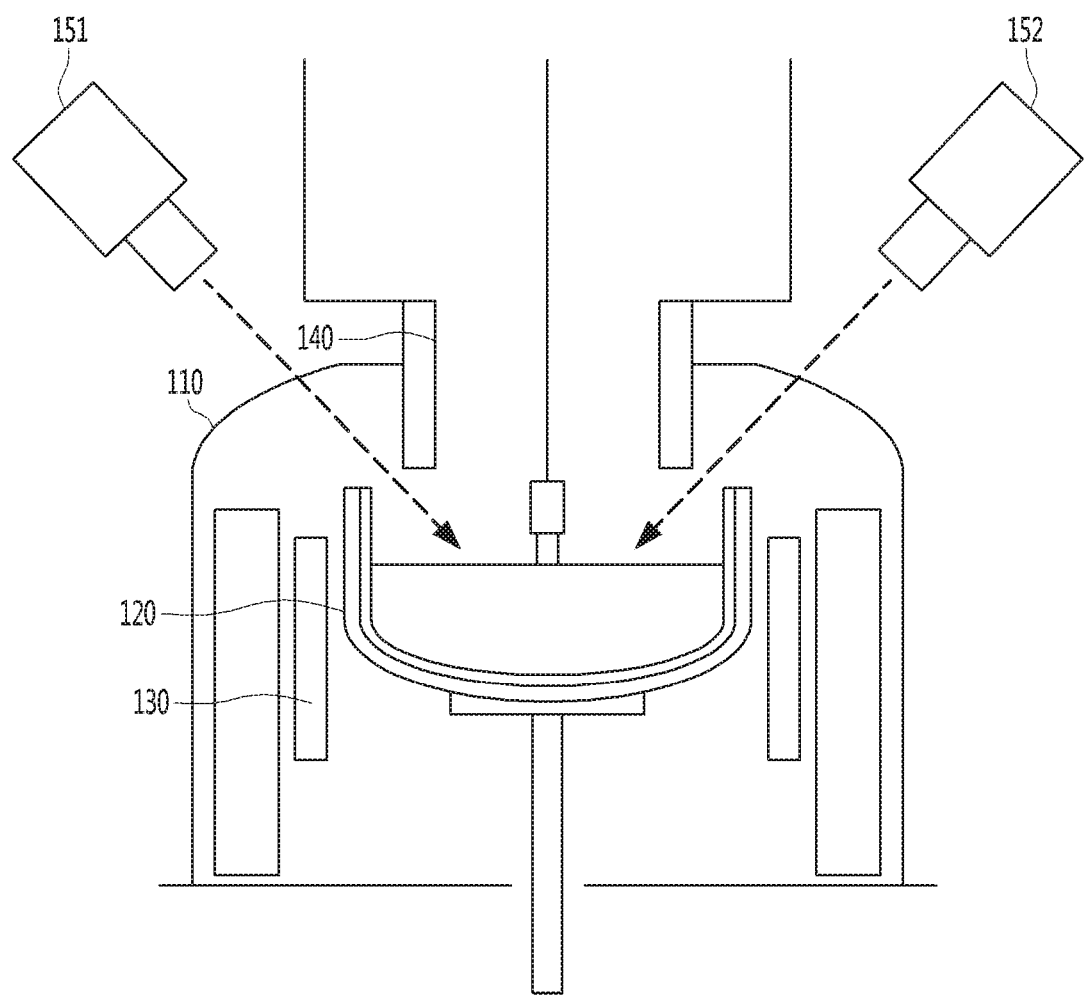
FIG. 3 is a side cross-sectional view schematically illustrating a single crystal growth device according to the present invention.
Figure 4:
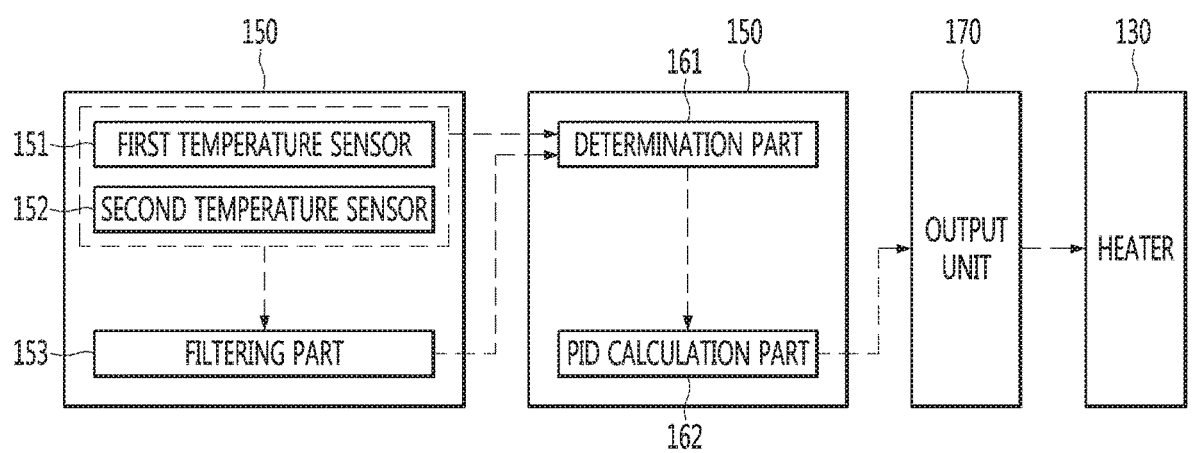
FIG. 4 is a configuration diagram illustrating a temperature control device applied to FIG. 3.

FIG. 3 is a side cross-sectional view schematically illustrating a single crystal growth device according to the present invention, and FIG. 4 is a configuration diagram illustrating a temperature control device applied to FIG. 3.

The single crystal growth device according to the present invention, as shown in FIG. 3, includes a crucible 120 in which a silicon melt is accommodated in a chamber 110 which is an enclosed space, a heater 130 configured to heat the crucible 120, and a heat shielding member 140 configured to cool down an ingot pulled up in the crucible 120, and includes a temperature control device (not shown) that processes a result of measuring a temperature of the silicon melt accommodated in the crucible 120 at two positions and then performs a proportional-integral-derivative (PID) calculation, and controls an operation of the heater according to the result.

The chamber 110 may include a cylindrical-shaped main body part in which the crucible 120 and the heater 130 are embedded, a dome-shaped cover part coupled to an upper side of the main body part and provided with a view port through which an ingot growing process can be observed, and a cylindrical-shaped pulling part coupled to an upper side of the cover part and providing a space in which the ingot may be pulled up, but is not limited thereto.

In addition, a seed chuck hanging a seed crystal, a seed wire connected thereto, and a drum at which the seed wire is wound are provided at an upper side of the chamber 110, and a separate control unit (not shown) may control a pulling speed by controlling an operation of the drum.

According to an embodiment, a pair of view ports are provided at both sides of an upper portion of the cover part, and first and second temperature sensors 151 and 152 are provided outside the view port, and the first and second temperature sensors 151 and 152 are applied with a pyrometer capable of measuring a temperature at two positions of a surface of the silicon melt accommodated in the crucible 120 in a non-contact manner.

Accordingly, since the first and second temperature sensors 151 and 152 are provided at both sides of the upper portion of the cover part, a measurement distance may be shorter than that of the conventional temperature sensor provided at an upper side of the pulling part, and the first and second temperature sensors 151 and 152 may be not affected by surrounding objects such as the heat shielding member 140 or the seed chuck, so that the surface temperature of the silicon melt may be measured more accurately.

At this point, the first and second temperature sensors 151 and 152 may be configured as a 1-color pyrometer or a 2-color pyrometer. Although the 2-color pyrometer has less noise than the 1-color pyrometer, since a measured temperature is processed by a filtering part 153 (shown in FIG. 4) to be described below, it does not matter which one is used.

In addition, in order to accurately measure the temperature of the surface of the silicon melt without interference of the ingot during a body growing process in addition to a shouldering process, it is preferable that the first and second temperature sensors 151 and 152 are configured so as to measure the temperature within a range of 10 cm from a diameter of the ingot growing from the silicon melt in the crucible 120.

Of course, even though the surface temperature of the silicon melt is measured within a range of 10 cm from the diameter of the ingot, the measured temperature does not change much as compared with the conventional one, and the surface temperature of the silicon melt is measured throughout the ingot growing process, so that a temperature control to be described below is possible.

The crucible 120 which is a container accommodating a silicon melt is driven to be rotated and elevated during the ingot growing process. Of course, the crucible 120 may be configured so as to block inflow of impurities and withstand even a high temperature, and may be configured in a form in which a quartz crucible and a graphite crucible are overlapped.

The heater 130 is provided at a circumference of the crucible 120 and liquefies a polycrystalline silicon material accommodated in the crucible 120 into the silicon melt by heating the crucible 120, and the temperature control device may control the operation of the heater 130 to control the temperature of the silicon melt affecting quality.

The heat shielding member 140 is provided to directly cool down the ingot to be grown from a high-temperature silicon melt, is installed to be hang above the crucible 120, and is composed of a graphite material capable of withstanding a high temperature.

At this point, a lower portion of the heat shielding member 140 is located above the surface of the silicon melt accommodated in the crucible 120, and is located to surround the ingot to be grown from the silicon melt accommodated in the crucible 120 while maintaining a predetermined distance.

Of course, the first and second temperature sensors 151 and 152 are installed such that the temperature may be measured at each point of the silicon melt which is not interfered by the heat shielding member 140.

The temperature control device, as shown in FIG. 4, includes an input unit 150 configured to measure and process a temperature of the silicon melt accommodated in the crucible 120 (shown in FIG. 3), a control unit 160 configured to perform the PID calculation of one of a measured temperature T1 and a processing temperature T2 of the input unit 150 and a set target temperature T0 as a output of the heater, and an output unit 170 configured to input the output of the heater calculated in the control unit 160 to the heater 130.

The input unit 150 includes the above-described first and second temperature sensors 151 and 152, and a filtering part that performs noise-elimination on two measured temperatures T11 and T12 measured at the first and second temperature sensors 151 and 152 and then performs arithmetic averaging to process to a processing temperature T2.

According to an embodiment, since the temperature is measured at two positions of the silicon melt by the first and second temperature sensors 151 and 152, the noise may be reduced even though the temperature is measured non-uniformly in specific regions of the surface of the silicon melt by rotating the crucible 120 (shown in FIG. 3).

However, since the silicon melt accommodated in the crucible 120 (shown in FIG. 3) naturally convects, it may be seen that the temperature of the silicon melt changes into a sine wave form. In consideration of this, it is preferable to process the measured temperature to the processing temperature of a sine wave form.

In detail, the filtering part 153 applies the measured temperature (T1=T11, T12) measured during a sampling time (Δt) to model with a sine wave function described in the following Equation 1, and calculates into an optimal sine wave function having the smallest amplitude, and then inputs a time to the optimal sine wave function in real time to perform noise-elimination filtering.

[Equation 1]

$$a, b, c, d = \min_{\bar{a},\bar{b},\bar{c},\bar{d}} \left\{ \sum_{\bar{t}=t}^{\bar{t}=t-Np\Delta t-\Delta t} \left(T(\bar{t}) - (\bar{a} + \bar{b}\bar{t} + \bar{c}\sin(\omega(\bar{t}-\bar{d})))\right)^2 \right\}$$

At this point, a, b, c and d denote model parameters obtained by optimization, T(t) denotes a measured temperature, Δt denotes a sampling time, NpΔt denotes a cycle, ω=2π/(NpΔt) denotes a frequency, and t denotes a current time.

As described above, the filtering part 153 processes the measured temperatures T11 and T12 at two positions into an optimal sine wave function having the smallest amplitude, and inputs a future time from the optimal sine wave function having the smallest amplitude to calculate final measured temperatures T21 and T22 in which noise is reduced, and arithmetically average the final measured temperatures T21 and T22 at the two positions in which noise is completely eliminated to calculate into one processing temperature T2, and thus an overall surface temperature of the silicon melt may be accurately obtained.

The control unit 160 may include a determination part 161 configured to select one of the measured temperature T1 and the processing temperature T2 according to an external input signal, and a PID calculation part 162 configured to perform PID calculation of one of the measured temperature T1 and the processing temperature T2 selected at the determination part 161 and the target temperature T0.

Of course, the determination part 161 may be a button or a signal that may be input by an operator, but is not limited thereto because it may change depending on a control environment.

In addition, the PID calculation part 162 compares one of the measured temperature T1 and the processing temperature T2 with the target temperature T0, and calculates P, I, and D values, respectively by using the generalized a PID equation according to the difference value to calculate the heater output, and thus it is possible to respond in real time.

Since the output unit 170 inputs the heater output outputted quickly in real time in the PID calculation part 162 to the heater 130 and controls the operation thereof, a time for converging the surface temperature of the silicon melt to the target temperature T0 may be shortened.

Figure 5:
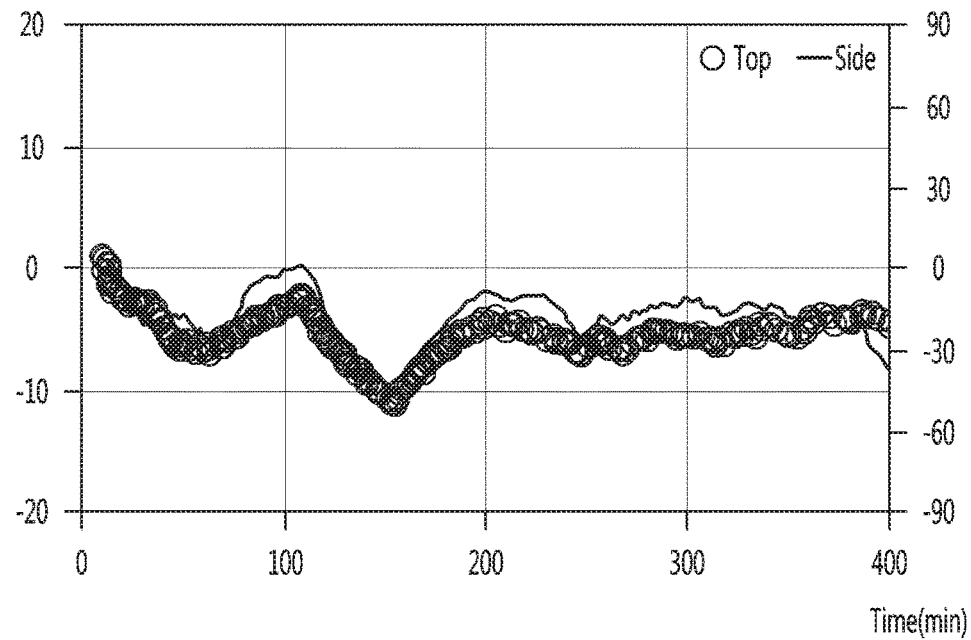
FIG. 5 is a graph illustrating temperature changes of a silicon melt measured by pyrometers of the related art and the present invention.

FIG. 5 is a graph illustrating temperature changes of a silicon melt measured by a pyrometer of the related art and the present invention.

In the related art, a pyrometer is located above a pulling part of a chamber, while in the present invention a pyrometer is located at both sides of an upper portion of a cover part of a chamber, and as shown in FIG. 5, a top pyrometer of the related art and a side pyrometer of the present invention measure the surface temperatures of the silicon melt, respectively, and the results are almost similar, so that the measured temperature may be reliable. Rather, it can be seen that the side pyrometer of the present invention measures the temperature more sensitively than the top pyrometer of the related art.

Accordingly, the present invention may provide a first embodiment in which a temperature control device is applied with two side pyrometers, but may also provide a second embodiment in which a temperature control device is applied with the side pyrometer and the top pyrometer one by one.

Figure 6:
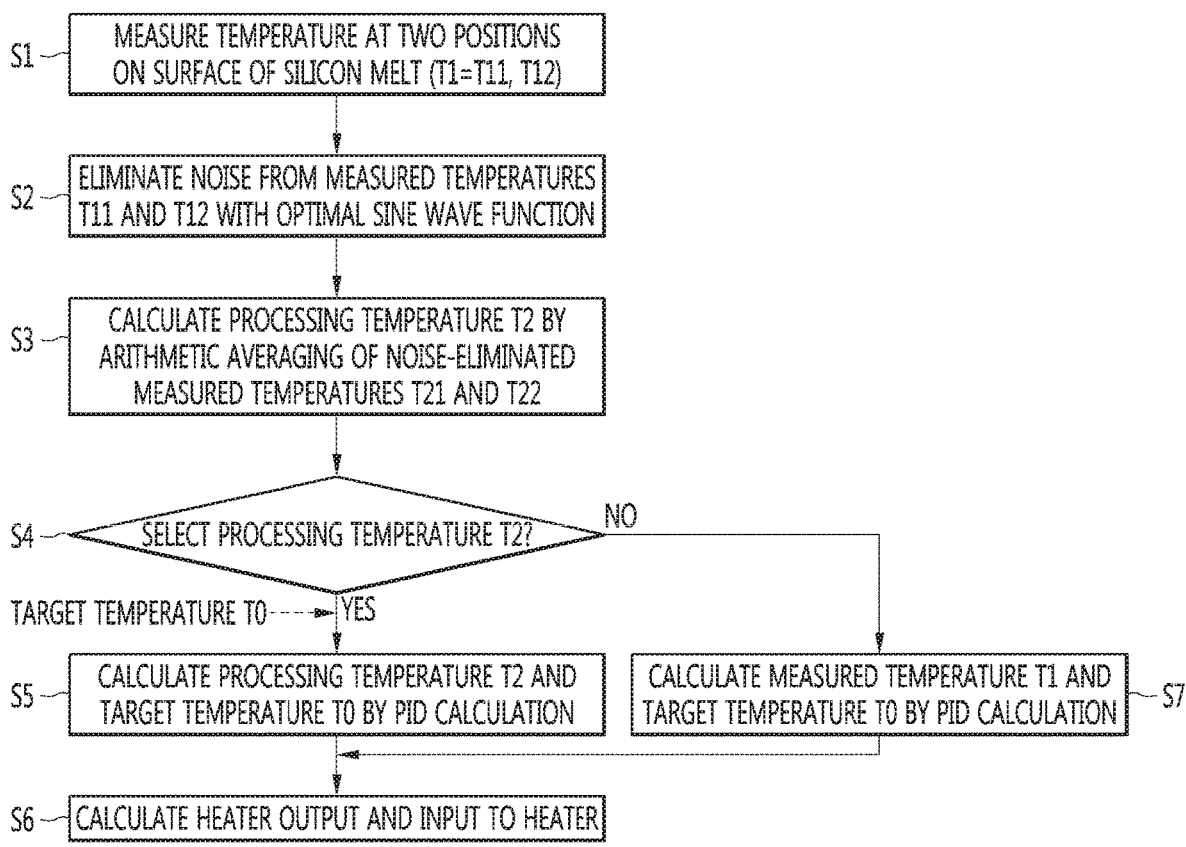
FIG. 6 is a flowchart illustrating a temperature control method for growing a single crystal ingot according to present invention.

FIG. 6 is a flowchart illustrating a temperature control method for growing a single crystal ingot according to the present invention.

Referring to FIG. 6, the temperature control method for growing a single crystal ingot according to the present invention is as follows.

First, a temperature is measured at two positions of a surface of a silicon melt. (see S1)

As a crucible rotates, the natural convection changes inside the silicon melt accommodated in the crucible while an ingot growth process is in progress, and the temperature may be measured non-uniformly in specific regions of the surface of the silicon melt.

However, it is possible to reduce noise by using an entire surface temperature of the silicon melt by measuring the surface temperature of the silicon melt at two positions in a non-contact manner, In addition, the two positions of the surface of the silicon melt in which the temperature is to be measured may be freely specified, and the temperature measurement should be performed within a range of 10 cm from the diameter of the ingot of the surface of the silicon melt so as not to interfere with the ingot or other components even in the body growing process in which the ingot is grown from the silicon melt.

Accordingly, the surface temperature of the silicon melt may be measured throughout the ingot growth process, and the temperature condition may be controlled throughout the ingot growth process by processing and reflecting the measured temperature as described below.

Next, noise is removed from the measured temperatures (T1=T11, T12) with an optimal sine wave function, and the noise-eliminated measured temperatures T21 and T22 are arithmetically averaged to calculate a processing temperature T2. (see S2 and S3)

When the silicon melt accommodated in the crucible is heated by a heater, a natural convection phenomenon occurs inside the silicon melt, and temperature changes of a sine wave form in which the surface temperature of the naturally convecting silicon melt is going up and down appear.

Accordingly, as described in the above Equation 1, a sine wave function is obtained with variables such as a measured temperature ($T(t)$), a sampling time ($\Delta t$), a cycle ($Np\Delta t$), a frequency ($\omega=2\pi/(Np\Delta t)$), and a current time ($t$) by applying the measured temperatures (T1=T11, T12) measured during the sampling time ($\Delta t$).

After calculating the sine wave function having the smallest amplitude among the sine wave functions obtained as described above into the optimum sine wave function, final measured temperatures T21 and T22 are calculated by inputting a time to the optimal sine wave function in real time and eliminating noise, and the processing temperature T2 may be obtained by arithmetically averaging the final measured temperatures T21 and T22.

Of course, the processing temperature T2 is calculated as the arithmetic averaging of the final measured temperatures T21 and T22, but a median of the final measured temperatures T21 and T22 may be applied in some cases.

Next, an operator selects whether to apply the processing temperature T2 (see S4).

The operator may select by pressing a separate button or inputting a control command, but is not limited thereto.

At this point, when the processing temperature T2 is selected, the processing temperature T2 and a target temperature T0 are subjected to PID calculation to calculate a heater output, and the heater output is controlled to be inputted to the heater (see S5 and S6).

Accordingly, the surface temperature of the silicon melt may be quickly and accurately converged to the target temperature T0 by comparing the processing temperature T2 undergone the filtering process with the target temperature T0 and performing a PID control according to the difference value.

Meanwhile, when the processing temperature T2 is not selected, the heater output is calculated by the PID calculation of the measured temperature T1 and the target temperature T0, and the heater output is controlled to be inputted to the heater (see S7 and S6).

Accordingly, by comparing the target temperature T0 with the measured temperatures (T1=T11, T12) actually measured at two positions by arithmetically averaging and performing the PID control according to the difference value, the surface temperature of the silicon melt may be quickly converged to the target temperature T0 even when accuracy is lower than that at which the processing temperature T2 is applied.

Figure 7:
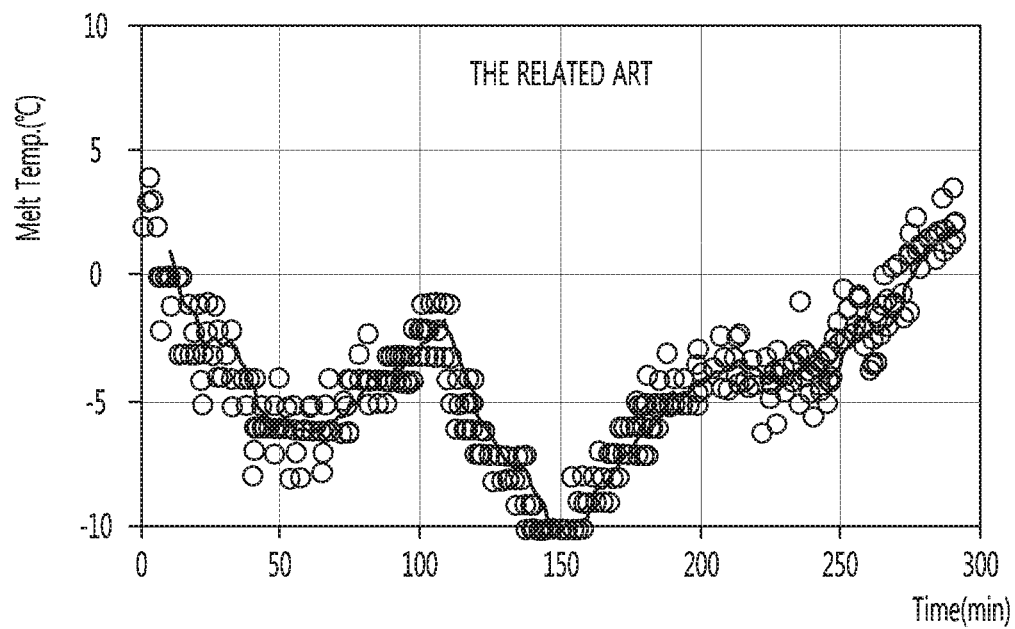
FIG. 7 is a graph illustrating temperature changes of a silicon melt as a result of temperature control during single crystal ingot growth according to the related art and the present invention.
Figure 7:
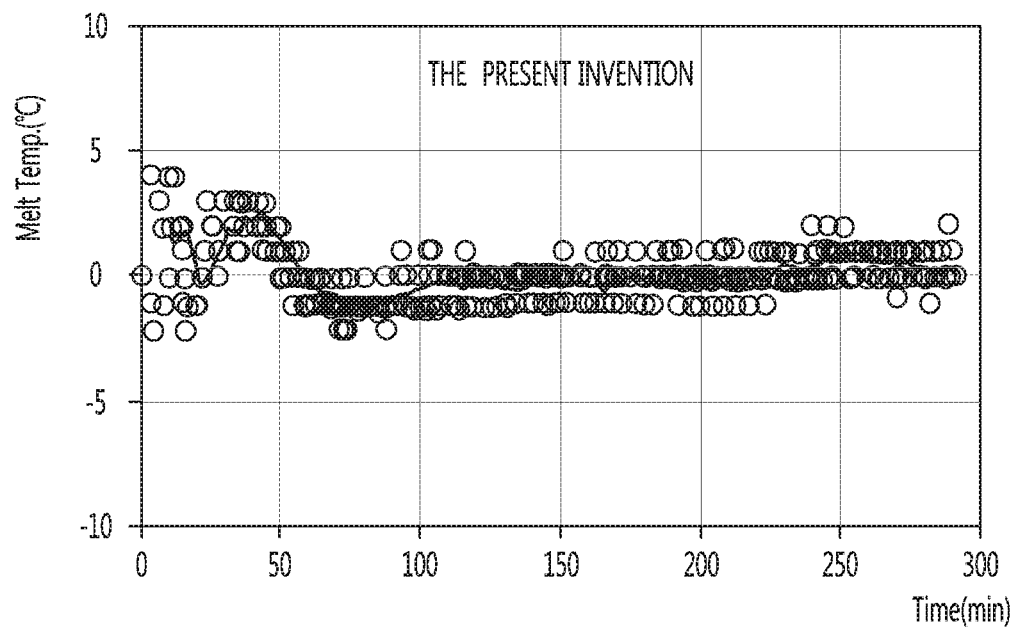

FIG. 7 is a graph illustrating temperature changes of a silicon melt as a result of temperature control during single crystal ingot growth according to the related art and the present invention.

In general, in the ingot growth process, when the temperature of the silicon melt is maintained for a predetermined time, a dipping process for dipping a seed in the silicon melt is proceeded and a necking process for pulling up the seed is proceeded.

Therefore, as the temperature of the silicon melt converges quickly to the target temperature before proceeding the dipping process, the time of the ingot growth process may be shortened.

In the related art, when the temperature measured by the top pyrometer deviates from the control line with reference to the target temperature, the heater is controlled by outputting a correction value from a previously inputted table, whereas, in the present invention, the processing temperature corrected by noise-elimination filtering and arithmetic averaging of the measured temperature by two side pyrometers is obtained, and the heater is controlled according to the result of the PID control by comparing the processing temperature with the target temperature.

As shown in FIG. 7, as a result of temperature control according to the related art, the time to converge to the target temperature is 250 minutes on average and the time to maintain the control line of the target temperature is 5 minutes, whereas, as a result of temperature control according to the present invention, the time to converge to the target temperature is 50 minutes on average and the time to maintain ±5° C. of the control line of the target temperature is 250 minutes.

As a result, since the dipping process and the necking process may be proceeded immediately after 50 minutes for maintaining the silicon melt at a predetermined temperature in the present invention, the process time may be shortened by about 200 minutes as compared with the related art.

According to the present invention, a temperature control device for growing a single crystal ingot and a temperature control method applied thereto may measure a surface temperature of a silicon melt and process a measured temperature by filtering to perform noise-elimination and arithmetic averaging and then calculate a heater output by a proportional-integral-derivative (PID) calculation of one of the measured temperature and a processing temperature and a target temperature according to an operator's determination, thereby controlling an operation of a heater.

Therefore, the measured temperature may be properly filtered even though a distance between a surface of the silicon melt and a temperature sensor is far or natural convection changes in the silicon melt according to a rotation speed of the crucible, and thus not only a temperature of the silicon melt can be accurately sensed and repeatability of control can be increased but also quantification of control can be possible.

In addition, the measured temperature of the silicon melt accurately obtained by the filtering is calculated by the PID calculation and the operation of the heater is controlled according to the result, and thus not only a temperature of the silicon melt can be quickly converged to a target temperature but also a uniform temperature environment can be continuously provided during the single crystal ingot growth. As a result, it is advantageous in that quality of a single crystal ingot can be quickly and accurately controlled to improve the quality thereof.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

DESCRIPTION OF REFERENCE NUMERALS

| | |
|---|---|
| 110: chamber | 120: crucible |
| 130: heater | 140: heat shielding member |
| 150: input unit | 151, 152: first and second temperature sensors |
| 153: filtering part | 160: control unit |
| 161: determination part | 162: PID calculation part |
| 170: output unit | |

What is claimed is:

1. A temperature control device for growing a single crystal ingot, which controls an operation of a heater for heating a crucible configured to accommodate a silicon melt, the device comprising: an input unit configured to measure a temperature of the silicon melt accommodated in the crucible and process the measured temperature of the silicon melt; a control unit configured to perform a proportional-integral-derivative (PID) calculation of one of the measured temperature T1 and the processing temperature T2 of the input unit and a target temperature T0 and calculate as an output of the heater; and an output unit configured to input the output of the heater calculated in the control unit to the heater;

wherein the input unit includes:
a sensor unit configured to measure the temperature of the silicon melt accommodated in the crucible at at least two positions; and
a filtering part configured to perform noise-elimination filtering and arithmetic averaging on at least two measured temperatures T11 and T12 measured at the sensor unit to process to a processing temperature T2,
wherein the filtering part is configured to apply the measured temperatures T11 and T12 measured during a sampling time ($\Delta t$) to model with a sine wave function and calculate into an optimal sine wave function with the smallest amplitude, and then input a time to the optimal sine wave function in real time so as to perform noise-elimination filtering.

2. The device of claim 1, wherein the sensor unit includes first and second temperature sensors installed at both sides of an upper portion of an enclosed chamber in which the crucible is accommodated in an inner space.

3. The device of claim 2, wherein the first and second temperature sensors are configured as a 1-color pyrometer or a 2-color pyrometer.

4. The device of claim 2, wherein the first and second temperature sensors measure a temperature within a range of 10 cm from a diameter of the ingot grown from the silicon melt in the crucible.

5. The device of claim 1, wherein the filtering part is configured to model the optimal sine wave function with variables selected from the group consisting of a measured temperature ($T(t)$), a sampling time ($\Delta t$), a cycle ($Np\Delta t$), a frequency ($\omega = 2\pi/(Np\Delta t)$), and a current time ($t$).

6. The device of claim 1, wherein the control unit includes a determination part for selecting one of the measured temperature T1 and the processing temperature T2 according to an external input signal, and a PID calculation part for PID calculation of one of the measured temperature T1 and the processing temperature T2 selected at the determination part and the target temperature T0.

* * * * *